United States Patent
Broberg, III

(10) Patent No.: US 7,017,093 B2
(45) Date of Patent: Mar. 21, 2006

(54) CIRCUIT AND/OR METHOD FOR AUTOMATED USE OF UNALLOCATED RESOURCES FOR A TRACE BUFFER APPLICATION

(75) Inventor: Robert Neal Carlton Broberg, III, Rochester, MN (US)

(73) Assignee: LSI Logic Corporation, Milpitas, CA (US)

( * ) Notice: Subject to any disclaimer, the term of this patent is extended or adjusted under 35 U.S.C. 154(b) by 387 days.

(21) Appl. No.: 10/245,148

(22) Filed: Sep. 16, 2002

(65) Prior Publication Data

US 2004/0054815 A1    Mar. 18, 2004

(51) Int. Cl.
*G01R 31/28* (2006.01)
(52) U.S. Cl. .................... 714/724; 714/733
(58) Field of Classification Search ............... 714/700, 714/701, 710, 711, 718, 719, 723, 724, 30, 714/38, 733; 716/17, 18
See application file for complete search history.

(56) References Cited

U.S. PATENT DOCUMENTS

| | | | |
|---|---|---|---|
| 5,406,525 A * | 4/1995 | Nicholes | 365/230.02 |
| 5,956,477 A | 9/1999 | Ranson et al. | |
| 5,978,902 A * | 11/1999 | Mann | 712/227 |
| 5,995,740 A | 11/1999 | Johnson | 395/500.41 |
| 6,055,492 A | 4/2000 | Alexander, III et al. | |
| 6,065,078 A | 5/2000 | Falik et al. | |
| 6,067,262 A * | 5/2000 | Irrinki et al. | 365/201 |
| 6,093,214 A | 7/2000 | Dillon | |
| 6,154,856 A | 11/2000 | Madduri et al. | |
| 6,275,956 B1 | 8/2001 | On et al. | |
| 6,591,378 B1 | 7/2003 | Arends et al. | |
| 6,738,929 B1 | 5/2004 | Swoboda et al. | |
| 6,779,145 B1 * | 8/2004 | Edwards et al. | 714/733 |
| 2001/0000323 A1 | 4/2001 | Barry | |
| 2003/0000561 A1 | 1/2003 | Edwards et al. | |

* cited by examiner

*Primary Examiner*—Guy Lamarre
*Assistant Examiner*—James C. Kerveros
(74) *Attorney, Agent, or Firm*—Christopher P. Maiorana PC

(57) ABSTRACT

An apparatus including a first circuit, a second circuit, and a third circuit. The first circuit may be configured to receive a plurality of input signals and present one of the plurality of input signals as a data signal in response to a control signal. The second circuit may be configured to generate the control signal and generate a trace data stream in response to the data signal. The third circuit may be configured to receive and store the trace data stream and read and present the stored trace data stream in response to one or more commands.

20 Claims, 3 Drawing Sheets

CIRCUIT AND/OR METHOD FOR AUTOMATED USE OF UNALLOCATED RESOURCES FOR A TRACE BUFFER APPLICATION

FIELD OF THE INVENTION

The present invention relates to an integrated circuit debugging device generally and, more particularly, to a circuit and/or method for an automated use of unallocated resources for a trace buffer application.

BACKGROUND OF THE INVENTION

Conventional trace buffer managers facilitate the probing of internal nodes of an integrated circuit design. With millions of internal nodes and typically less than 500 external pins, modern integrated circuit designs present a substantial challenge for engineers and technologists looking to debug circuit designs. It can be very difficult to see what transpires at the transistor level within a Very Large Scale Integration (VLSI) design.

A conventional Trace Buffer Manager (TBM) is an optional piece of hardware that can be implemented one or more times in the reference portion of an integrated circuit design. Each trace buffer manager that is implemented collects debug information from other units on the chip, multiplexes the debug information into a single I/O path, optionally applies simple filtering rules to the collection method, and logs the data into one or more random access memory units. In addition to being logged, the filtered data can be sent to an output bus which is optionally connected to external I/O pins to be monitored by a logic analyzer or other piece of hardware. Conventional approaches implement a trace buffer manager that has a dedicated bank of RAM or can access memory that is shared with other logic circuits through multiplexers. The memory implemented for the trace function is minimized to minimize die size and cost. The trace point paths in conventional designs are manually designed when the chip is laid out.

It would be desirable to implement a trace buffer manager that may be implemented (i) with allocated memory on the die that is not used by the reference design, (ii) without allocating dedicated RAM, (iii) to maximize the amount of memory available to the trace buffer manager, and (iv) to minimize wasted die real estate.

SUMMARY OF THE INVENTION

The present invention concerns a first circuit, a second circuit, and a third circuit. The first circuit may be configured to receive a plurality of input signals and present one of the plurality of input signals as a data signal in response to a control signal. The second circuit may be configured to (i) generate the control signal and (ii) generate a trace data stream in response to the data signal. The third circuit may be configured to (i) receive and store the trace data stream and (ii) read and present the stored trace data stream in response to one or more commands.

The objects, features and advantages of the present invention include implementing a circuit and/or method for automated use of unallocated resources for a trace buffer manager that may (i) select which signals are to feed a trace buffer memory array from among a number of specified signals on a per module basis, (ii) synchronize the signals from each logic module into the clock domain of the trace buffer memory, (iii) write the selected trace buffer data stream to the trace buffer memory, (iv) read the selected trace buffer data stream from the trace buffer memory, (v) present an external data stream on an external trace output interface, (vi) bypass the trace buffer memory and directly present the data to the trace output interface, (vii) filter the trace data stream before sending to the trace buffer memory or the trace output interface, (viii) design the trace buffer manager to exploit unused diffused memory resources on a die, and/or (ix) notify external logic (e.g., with an interrupt signal, attention signal, or other signal) of the remaining capacity of the trace buffer.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

A trace buffer (e.g., a trace buffer array or a trace buffer memory) and a trace output interface are useful for debugging prototype chips in the lab and in the field. The present invention may tie the use of a trace buffer array and interface with a collection of unused diffused memory resources on a die (e.g., the physically scattered, unused memory on an integrated circuit). The present invention may automatically generate logic that creates the trace buffer array and interconnects various logic modules feeding the trace buffer array, the trace output interface, and a trace buffer manager.

In integrated circuit manufacturing processes in which the present invention is directed, pre-existing die designs contain memory banks, gate array banks, I/O units, capacitors, and other components for fabricating the circuit. A reference design is generated from the pre-existing die designs by connecting the nodes to be monitored and creating trace paths by laying down additional metal and/or removing insulative material. However, the pre-existing die designs generally serves as a warehouse of circuit components to be selected from. Blocks of the die often remain unused and are wasted once the circuit fabrication process is complete. The present invention may assign unused diffused memory resources to the trace buffer. The diffused memory resources are generally configured to be addressed as one contiguous block of memory.

Figure 1:
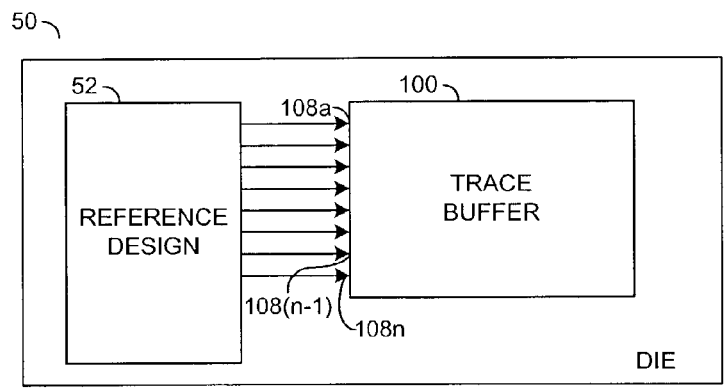
FIG. 1 is a block diagram illustrating a context of the present invention.

Referring to FIG. 1, a block diagram of a circuit 50 is shown illustrating a context of the present invention. The circuit 50 may be a die of an integrated circuit. In one example, the circuit 50 may be implemented as an Application Specific Integrated Circuit (ASIC). A trace buffer 100 may be implemented in the circuit 50. The circuit 100 may receive a plurality of inputs from a circuit 52. The circuit 52 may comprise a plurality of structures on the circuit 50 that may implement a reference design of an integrated circuit. The trace buffer 100 may poll (e.g., collect) the status of various nodes within the circuit 52 as data received through a number of inputs 108a–108n of the circuit 100. The data may be stored within the trace buffer 100. The data may be used to debug the circuit 52.

Figure 2:
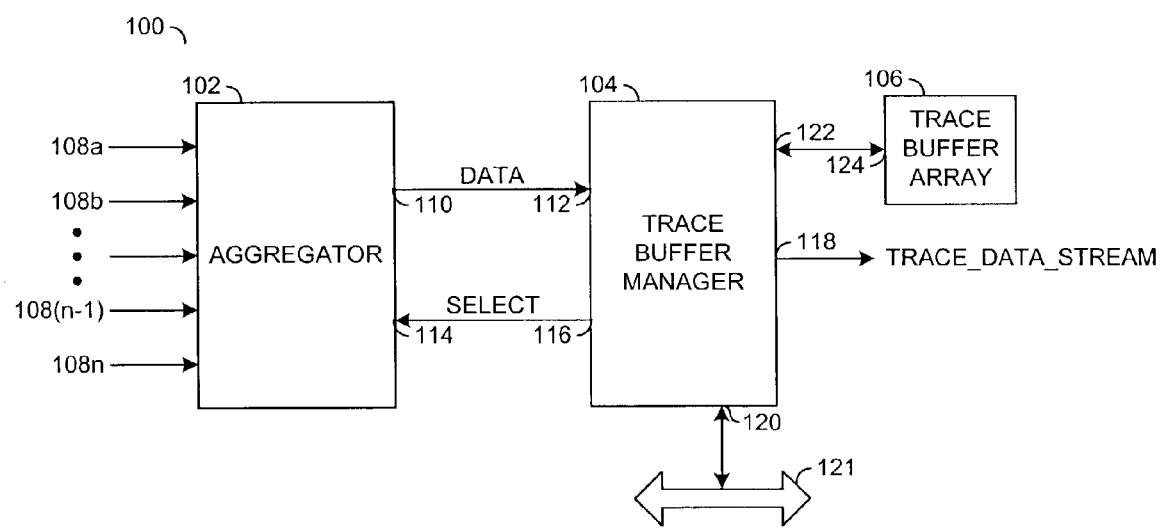
FIG. 2 is a block diagram illustrating a preferred embodiment of the present invention.

Referring to FIG. 2, a block diagram of the circuit 100 is shown in accordance with a preferred embodiment of the present invention. The circuit 100 may implement a trace buffer employing an automated use of unallocated resources approach. The circuit 100 generally comprises an aggregator 102, a trace buffer manager 104, and a trace buffer array 106. The aggregator 102 may receive signals from the inputs 108a–108n. The inputs 108a–108n may be implemented as multi-bit inputs that may collect debug information from the reference design 52. The aggregator 102 may have a multi-bit output 110 that may provide a data signal (e.g., DATA) to an input 112 of the trace buffer manager 104. The aggregator may have an input 114 that may receive a control signal (e.g., SELECT) that may control the aggregator 102. The aggregator 102 may comprise, in one example, a multiplexer (to be described in more detail in connection with FIG. 3). The aggregator 102 may provide one of the signals from the inputs 108a–108n to the output 110 in response to the signal SELECT. While a multiplexer has been described, other logic and/or combination of logic may be implemented to meet the design criteria of a particular application.

The trace buffer manager 104 may have an input 112 that may receive the signal DATA. The trace buffer manager 104 may have an output 116 that may present the signal SELECT and an output 118 that may present a signal (e.g., TRACE_DATA_STREAM) to an external trace output interface. The trace manager 104 may have an input/output 120 that may be coupled to a bus 121 and an input/output 122 that may interface with the trace buffer array 106. In one example, the bus 121 may be implemented as an advanced high-performance bus (AHB). An example of AHB hardware may be defined in the AMBA™ Specification (Rev. 2.0), 1999, which is hereby incorporated by reference in its entirety. However, other busses may be implemented accordingly to meet the design criteria of a particular implementation.

The trace buffer array 106 may have an input/output 124 that may interface with the input/output 122 of the trace buffer manager 104. The trace buffer array 106 may comprise a collection of unused diffused non-homogeneous memory resources on the integrated circuit 50. The memory resources may be configured as one contiguously accessible array of memory.

Figure 3:
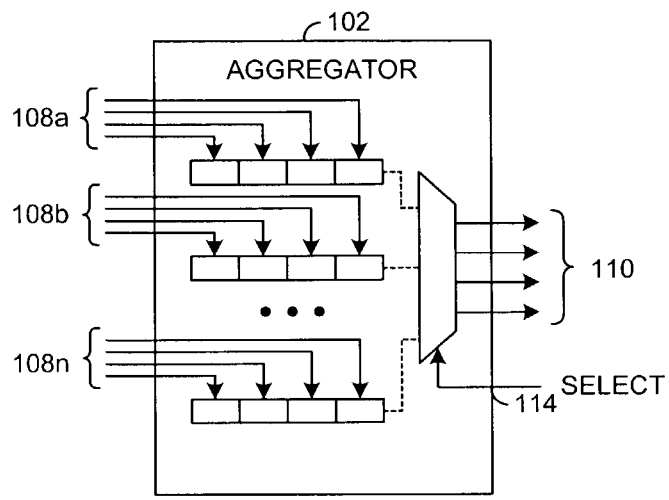
FIG. 3 is a more detailed diagram of the aggregator shown in FIG. 2.

Referring to FIG. 3, a more detailed diagram of the aggregator 102 is shown. In one example, the multi-bit inputs 108a–108n may each represent four input lines. Each input line of each input 108a–108n may accept 16 bits in parallel. In such an example, each multi-bit input 108a–108n may comprise a 64-bit input. The output 110 may provide one of the 64-bit inputs 108a–108n to the circuit 104 in response to the signal SELECT received at the input 114. The aggregator 102 may comprise a set of 64 multiplexers of input bit width n (where n is an integer) each configured to work in parallel in response to the control signal SELECT. While a 64-bit input and output have been described, other bit widths may be implemented accordingly to meet the design criteria of a particular implementation.

The boxes in FIG. 3 represent data bits. Each line 108a–108n represents a bus with a predetermined width (e.g., 8 bits). For example, valid selections for the output 110 may be any of the following:

1) 108a[3] 108a[2] 108a[1] 108a[0]
2) 108c[3] 108b[2] 108a[1] 108c[0]
3) 108a[0] 108c[3] 108c[3] 108b[2]

The same segment (e.g., 108c[3]) may be presented in multiple segments of the output 110. In such an example, 4 multiplexers (1 per each segment of the output 110) can select from any of the segments. However, other implements of the hardware may be used to reduce the gate count (e.g., from 4 muxes to 2 or even 1). However, such a reduction in gate count may reduce the overall functionality.

Figure 4:
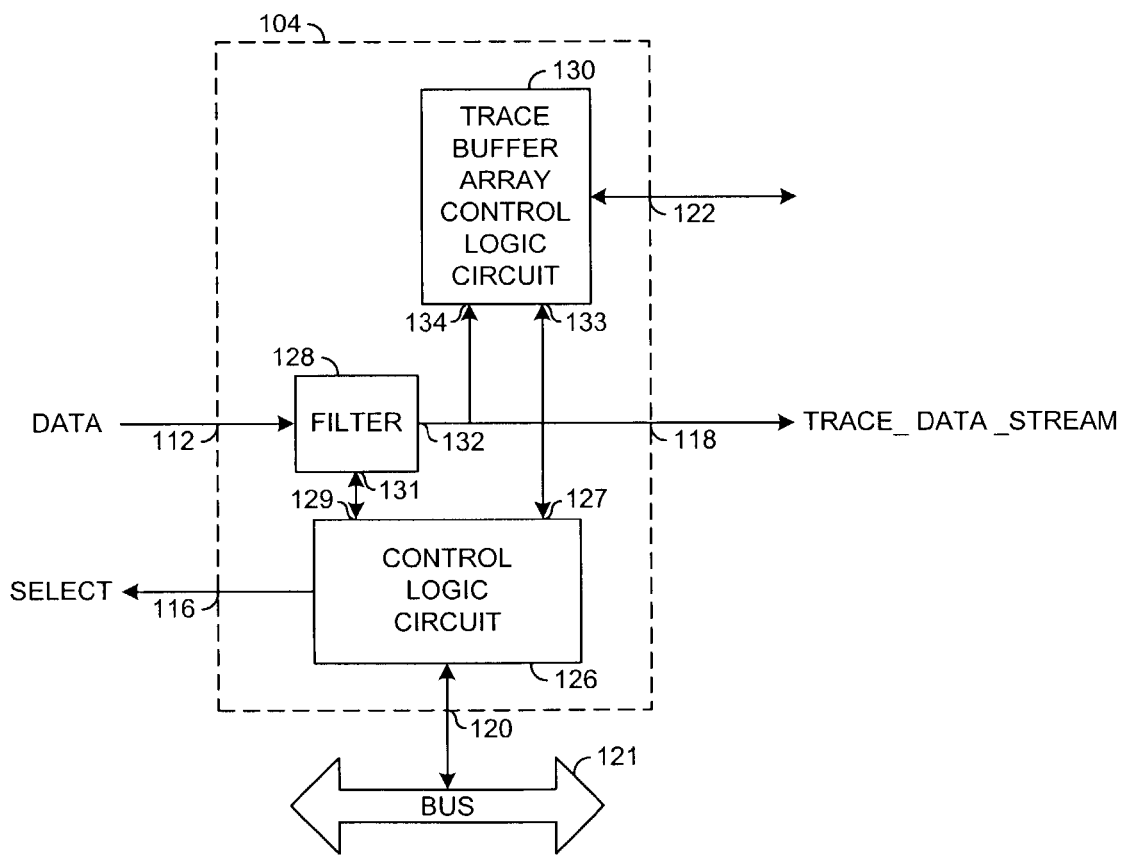
FIG. 4 is a more detailed diagram of the trace buffer manager of FIG. 2.

Referring to FIG. 4, a more detailed diagram of the trace buffer manager 104 is shown. The trace buffer manager 104 generally comprises a circuit 126, a filter 128, and a circuit 130. The logic circuit 126 may be implemented as a control logic circuit. The circuit 130 may be implemented as a trace buffer array control logic circuit. The control logic circuit 126 may present the signal SELECT to the output 116. The control logic circuit 126 may be connected to the bus 121 through the input/output 120. The input/output (e.g., interface) 120 to the bus 121 may be bidirectional. The bus 121 may be used to provide commands to the trace buffer manager 104. In one example, such commands may be presented by an AHB bus. The commands sent to the control logic 126 may include commands to control (i) which modules to poll on the IC (e.g., the signal SELECT to control the aggregator 102), (ii) where to send the TRACE_DATA_STREAM (e.g., to external trace output 126, trace buffer array 106, and/or output 120), and/or (iii) what operation the filter 128 should perform. The bus 121 may receive the signal TRACE_DATA_STREAM, information about the capacity and/or free space of the trace buffer array 106, and/or other operating data from the trace buffer 100. The control logic circuit 126 may also have an input/output 127 that may interface with the trace buffer array control logic circuit 130 and an input/output 129 that may interface with the filter 128.

The filter 128 may receive the signal DATA from the input 112. The filter 128 may have an output 132 that may be implemented, in one example, as a 64-bit data output with an additional error checking bit. The output 132 may generate the signal TRACE_DATA_STREAM. The signal TRACE_DATA_STREAM may be provided to an input/output 134 of the trace buffer array control logic circuit 130 and/or to an external trace output interface via the output 118. The filter 128 may also have an input/output 131 that may receive and/or send commands and/or data (e.g., filter parameters) to/from the control logic circuit 126.

The trace buffer array control logic circuit 130 may have an input/output 122 that may be coupled to the trace buffer array 106 (e.g., available RAM) that may comprise the collection of unused diffused memory resources on the integrated circuit 50. The trace buffer array control logic 130 may coordinate the reading/writing of the signal TRACE_DATA_STREAM to/from the trace buffer array 106. The trace buffer array control logic circuit may also have an input/output 133 that may be coupled to the input/output 127. The input/output 133 may receive commands from the control logic circuit 126 and/or send the contents of the trace buffer array 106 to the bus 121 via the input/output 120. The memory resources of the trace buffer array 106 may be physically scattered across the circuit 50, but may be configured to operate as one block of contiguously addressable memory.

In operation, the aggregator 102 may select a particular signal among the input signals 108a–108n to be presented to the input 112 of the trace manager 104. The particular signal 108a–108n may be selected in response to the signal SELECT. Each of the multi-bit signals 108a–108n may be associated with a different unit or module on the integrated circuit 50. The present invention may synchronize the signals from each logic module into the clock domain of the trace buffer array 106. The clock domain is generally controlled by the trace buffer array control logic circuit 130 and accessed via the input/output 124.

The trace buffer manager 104 may synchronize data for asynchronous access of the integrated circuit 50. The trace buffer manager 104 may provide for writing the signal TRACE_DATA_STREAM into the trace buffer array 106 via the input/output 122 of the trace buffer array control logic 130. The trace buffer array control logic circuit 130 may provide for writing the contents of the trace buffer array 106 to the bus 121 connected to input/output 120 of the control logic circuit 126. The trace buffer manager 104 may also read the selected trace data stream from the trace buffer array 106 via the input/output 122.

The trace buffer array 106 may be bypassed and the filter output 132 may directly present the signal TRACE_DATA_STREAM to the external trace output interface 118. The filter 128 may filter the signal TRACE_DATA_STREAM before being sent to the array control logic 130, the trace buffer array 106 and/or the external trace output interface 118. The trace buffer manager 104 may notify external logic of the remaining capacity of the trace buffer array 106. Notification may include generating an interrupt signal, an attention signal or other type of notification signal.

The trace buffer array 106 may write or read data to the memory in response to a command sent from the trace buffer array control logic 130. The commands controlling the memory in the trace buffer array 106 may be multiplexed with the data (e.g., time division multiplexed), embedded, or otherwise transmitted as part of the data stream. For example, the control commands may be a series of bits proceeding and/or succeeding the data packets.

Figure 5:
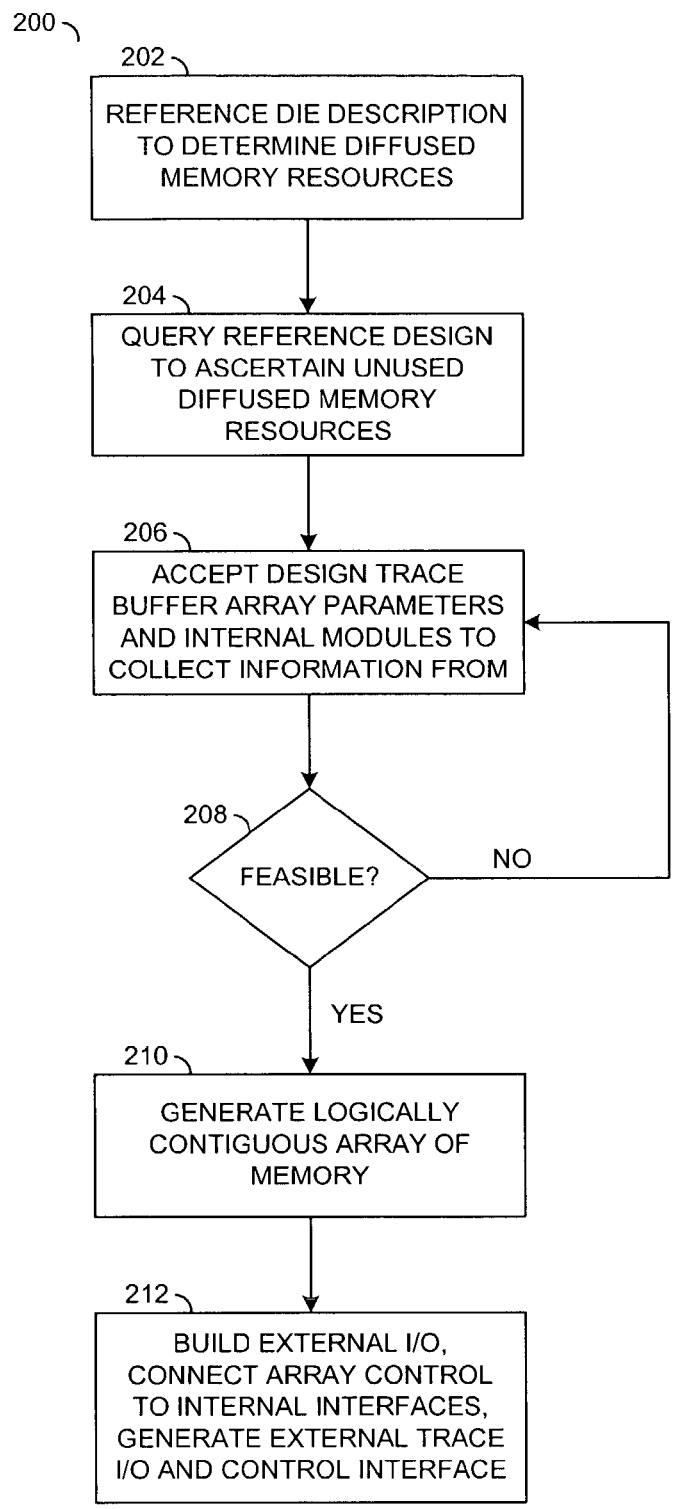
FIG. 5 is a flow chart showing an example logic or process of the present invention.

Referring to FIG. 5, a flow chart illustrating an example logic (or process) of the present invention is shown. During the design process where a trace buffer manager 104 is being incorporated onto an integrated circuit design, a design tool may automatically generate the trace buffer memory architecture (e.g., the trace buffer array 106) and its controlling logic (e.g., the control logic 126, the filter 128, and the trace buffer array control logic 130). The process 200 generally represents an example of the stages the design tool may follow. The process 200 generally comprises a stage 202, a stage 204, a stage 206, a decision stage 208, a stage 210, and a stage 212. The stage 202 may reference the die description to determine the diffused memory resources available. When the resources have been determined, the process 200 generally moves to the stage 204.

While in the stage 204, the process 200 may query the existing logic design (e.g., the chip layout without the added trace buffer manager 104) to determine which diffused memory resources are allocated. The process 200 generally moves to the stage 206 after determining the allocated resources. While in the third stage 206, the process 200 may accept as inputs design parameters for desired trace buffer array size, configuration, and width, as well as the width, speed, and I/O buffer selection for the external trace output interface 118. Additionally, the process 200 may accept as an input a list of internal interfaces that feed the trace buffer manager 104. The parameters accepted may include, but are not limited to, the address map logic for the trace buffer array 106, the multiplexer (e.g., aggregator 102) design parameters, control logic for the specified input interfaces, inclusion of the read/write/filter logic for the trace buffer manager, and connection to a specified trace output interface.

When the design parameters have been received, the process 200 generally moves to the stage 208. While in the decision stage 208, the process 200 may evaluate the design parameters to determine if there is a feasible solution given the die resources and the reference design requirements. If the trace buffer design parameters are not feasible, the process 200 may return to the stage 206. If the design parameters are feasible, the process 200 may proceed to the stage 210.

While in the stage 210, the process 200 may build a logically contiguous array of memory according to the design parameters from the unused diffused memory resources. The process 200 generally proceeds to the stage 212. In the stage 212, the process 200 may reference the unused I/O resources of the die, build an external trace output interface 118, and connect trace buffer logic to internal interfaces, the generated trace output interface 118, and an internal control interface. In one example, an AHB interface may be implemented to facilitate initiation of transactions (e.g., AHB, etc.) via a proprietary protocol. However, other types of interfaces may be implemented to meet the design parameters of a particular application.

The function performed by the flow diagram of FIG. 5 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

Using unused diffused memory resources on a die for a trace buffer application presents the possibility that chip yield, per wafer, may decline since the likelihood of encountering functionally critical defects increases. For commercial, high volume production, manufacturing test results for the trace buffer circuit 100 and associated logic may be isolated such that parts with defects only in the trace buffer circuit may be considered to be good parts for applications where the trace buffer is not used. The integrated circuit 50 may be designed such that the trace buffer array 106 and the trace buffer manager 104 may be isolated from the rest of the chip. The internal scan path may be separable from the external scan path. As such, the trace buffer circuit 100 may be disabled if defects are found only in the trace buffer circuit 100. For example, information from the chip tester may be used to determine if a failure is only in the trace buffer 100. In such an example, the circuit 50 may still be packaged, but labeled appropriately (e.g., non-trace enabled, or something similar).

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
    a first circuit configured to receive a plurality of input signals and present one of said plurality of input signals as a data signal in response to a control signal;
    a second circuit configured to (i) generate said control signal and (ii) generate a trace data stream in response to said data signal; and
    a third circuit comprising one or more unallocated diffused memory resources and configured to (i) receive and store said trace data stream and (ii) read and present said stored trace data stream in response to commands, wherein said one or more unallocated diffused memory resources include blocks of memory that are unused by a reference design once a fabrication process is complete.

2. The apparatus according to claim 1, wherein said plurality of input signals comprise one or more multi-bit signals.

3. The apparatus according to claim 1, wherein said first circuit comprises an aggregator configured to select among said plurality of input signals to feed to a trace buffer manager.

4. The apparatus according to claim 3, wherein said trace buffer manager is configured to synchronize a selected one of said plurality of input signals into the clock domain of a trace buffer array.

5. The apparatus according to claim 1, wherein said second circuit comprises:
    a filter configured to generate said trace data stream in response to one of said plurality of input signals and one or more second control signals;
    a control circuit configured to generate said control signal in response to said one or more second control signals and one or more third control signals; and
    an array control circuit configured to receive or present said trace data stream from or to said third circuit in response to said one or more third control signals.

6. The apparatus according to claim 5, wherein said filter, said array control circuit, and said control circuit are configured as a trace buffer manager.

7. The apparatus according to claim 6, wherein said trace buffer manager is designed to address said unallocated diffused memory resources on a die.

8. The apparatus according to claim 7, wherein said unallocated diffused memory resources are minimized.

9. The apparatus according to claim 7, wherein the amount of said unallocated diffused memory resources assigned to said trace buffer manager is maximized.

10. The apparatus according to claim 7, wherein said unallocated diffused memory resources are addressed as one contiguous block of memory.

11. The apparatus according to claim 10, wherein (i) said reference design is generated from pre-existing die designs and (ii) said unallocated diffused memory resources are (a) left over blocks of said pre-existing die designs after said fabrication process is complete and (b) physically scattered on said die.

12. The apparatus according to claim 7, wherein said unallocated diffused memory resources are automatically assigned to said trace buffer manager and traces to said unallocated diffused memory resources are automatically laid out by a software tool.

13. The apparatus according to claim 5, wherein said control circuit is configured to communicate with an external advanced high performance (AHB) bus.

14. The apparatus according to claim 1, wherein said trace data stream comprises a 64-bit signal with an additional error checking bit.

15. The apparatus according to claim 1, wherein said third circuit comprises a trace buffer array and said commands are provided as part of said trace data stream.

16. The apparatus according to claim 1, wherein said second circuit is configured to present said trace data stream to an external trace output interface.

17. An apparatus comprising:
    means for receiving a plurality of input signals and providing one of said plurality of input signals as a data signal in response to a control signal;
    means for (i) generating said control signal and (ii) generating a trace data stream in response to said data signal; and
    means for (i) receiving and storing said trace data stream and (ii) reading and presenting said stored trace data stream in response to commands, wherein said means for (i) receiving and storing and said means for (ii) reading and presenting comprises one or more unallocated diffused memory resources that include blocks of memory that are unused by a reference design once a fabrication process is complete.

18. A method for generating an automated use of unallocated diffused memory resources for a trace buffer comprising the steps of:
    (A) referencing a die description to determine available diffused memory resources;
    (B) querying a reference design to ascertain unallocated portions of said available diffused memory resources, wherein said unallocated portions of diffused memory resources include blocks of memory that are unused by said reference design once a fabrication process is complete;
    (C) accepting a set of design trace buffer array parameters and a set of internal modules to collect information from;
    (D) evaluating said set of design trace buffer array parameters to determine if said design trace buffer array parameters are feasible; and
    (E) generating a logically contiguous array of memory from said unallocated portions of diffused memory resources if said set of design trace buffer array parameters are feasible.

19. The method according to claim 18, further comprising the step of:
    (F) building an external I/O interface, connecting an array control to one or more internal interfaces, and generating an external trace output interface for said trace buffer.

20. The method according to claim 18, wherein said logically contiguous array of memory comprises all unallocated diffused memory resources on a die.

* * * * *